United States Patent
Marini

(10) Patent No.: US 6,482,713 B2
(45) Date of Patent: Nov. 19, 2002

(54) SHOT AVERAGING FOR FINE PATTERN ALIGNMENT WITH MINIMAL THROUGHPUT LOSS

(75) Inventor: Edward J. Marini, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/909,226

(22) Filed: Jul. 19, 2001

(65) Prior Publication Data

US 2002/0019065 A1 Feb. 14, 2002

Related U.S. Application Data

(60) Provisional application No. 60/222,208, filed on Aug. 1, 2000.

(51) Int. Cl.$^7$ ................................................. H01L 21/76
(52) U.S. Cl. ........................................ 438/401; 438/462
(58) Field of Search ................................. 438/401, 462, 438/5–13, 14–18

(56) References Cited

U.S. PATENT DOCUMENTS

| | | | |
|---|---|---|---|
| 5,596,204 A | * | 1/1997 | Irie et al. ..................... 250/548 |
| 5,740,065 A | | 4/1998 | Jang et al. ................... 364/488 |
| 5,792,580 A | | 8/1998 | Tominatu ..................... 430/22 |
| 6,043,864 A | | 3/2000 | Lo et al. ....................... 355/53 |

* cited by examiner

Primary Examiner—Craig Thompson
(74) Attorney, Agent, or Firm—Jacqueline J. Garner; Wade James Brady, III; Frederick J. Telecky, Jr.

(57) ABSTRACT

A way to average alignment measurements that obtains the advantage of multiple alignment marks per shot without requiring actual measurement of all alignment marks on all wafers of a batch. All alignment marks on all sampled shots are measured and averaged on the first wafer of a batch. The offset between a single sampled alignment mark and the average total offset for the wafer is characterized and applied when that alignment mark is sampled on succeeding wafers.

11 Claims, 3 Drawing Sheets

SHOT AVERAGING FOR FINE PATTERN ALIGNMENT WITH MINIMAL THROUGHPUT LOSS

This application claims priority under 35 USC § 119(e)(1) of provisional application No. 60/222,208 filed Aug. 1, 2000.

BACKGROUND AND SUMMARY OF THE INVENTION

The present application relates to integrated circuit fabrication, and more specifically to photolithographic processes used in IC fabrication.

BACKGROUND

Photolithography is a major element of IC fabrication. Several technologies have been developed to produce resist patterns small enough to meet the size requirements of the industry. Ever decreasing size requirements mean that smaller and smaller resist patterns must be placed on wafer surfaces to etch the necessary features. Alignment of wafers has therefore become an important part of IC fabrication, since misalignments that once were within pattern tolerance are no longer acceptable.

Alignment of wafers is accomplished in a variety of ways. Typically, marks are placed on wafer surfaces that indicate the correct placement of the wafer within the exposure system, so that when the wafer is exposed, the exposure pattern will correctly lie with respect to previous underlying patterns already present on a wafer. In some applications, where gates and other features require extremely precise pattern alignment, errors on the order of tens of nanometers must be corrected. This requires an alignment procedure capable of consistently placing patterns to within such a tolerance.

High resolution lithographic tools, such as steppers and step-and-scan tools, are used to print multiple patterns, or shots, on a substrate. Though methods vary, generally a stepper samples several shots, or single exposures of a pattern on the wafer surface, to check the wafer alignment. According to the overall map for the chip pattern, several shots are sampled, each containing alignment information in the form of one or more alignment marks. Steppers use software "recipes," where a separate family of recipes exists for each device being fabricated, and where each recipe samples certain shots to optimize alignment for that particular device.

Alignment marks determine the offset needed to properly align the wafer, typically in cartesian coordinates. There will often be separate marks for x-direction and y-direction orientation, though combinational marks also exist that align the wafer in both directions with a single mark structure. The information gathered from the alignment marks can be in many forms, such as a digital image of the mark or an interference pattern corresponding to the mark's orientation and location. The exact method depends on many factors, such as the material used, planarization, etc. Different device fabrication procedures and different exposure systems therefore use different sampling modes to gather information from the alignment marks.

Alignment systems in general are designed for a given device fabrication using a given pattern exposure system. Though the optics used in IC fabrication exposure are among the best in the world, distortion still exists, and as device sizes decrease even the best optics available produce distortion that can cause pattern alignment failure.

During printing of a device, a given level is printed and alignment marks are made for orienting and aligning the wafer when a later level of the device is exposed. Each subsequent pattern is aligned to marks on the wafer which were printed at one of the previous pattern steps. However, during printing, the patterns may be minutely displaced in the x- and y-direction, depending on their positions in the imaging field and on the lens distortion associated with that position. This displacement is controlled as much as possible, but remains significant compared to the alignment tolerance. Alignment marks themselves also experience this displacement, depending on which area of the lens is used to print each mark on a given device. This arises from the fact that different sections of the lens produce different distortion in an image.

One solution to this problem has been to compile databases of information on every device type (numbering in the hundreds) and every exposure system (often fifteen or more) to create custom offsets that predict and compensate for the distortions of a given device layer. These databases quickly grow to immense size, and often are useless when changes are made to device processes or new devices are introduced.

In recent alignment systems, several alignment marks are sampled from each of several shots, and then averaged to produce a total alignment for the wafer. Though this method minimizes the need for custom offset databases, it is time consuming. A wafer spends a certain amount of time on the tool for preparation (including alignment of the wafer), printing, and overhead tasks. As an example, alignment for only one x and y alignment mark per shot on 8 shots per wafer may take 20 seconds out of a total 90 seconds on the wafer in a typical system. If eight marks are used for averaging, the alignment time increases to 160 seconds, adding 140 seconds to the entire process and reducing throughput to 40%.

The IC fabrication art would therefore benefit from a process which obtained the advantages of multi-sample averaging without the drastic reduction in throughput.

Shot Averaging for Fine Pattern Alignment with Minimal Throughput Loss

The present application discloses a method of shot averaging that uses information gathered from the first wafer of a batch to derive alignment mark relationships on later wafers. This innovative process alleviates the need to measure the locations of all alignment marks on succeeding wafers of a batch.

Advantages of the disclosed methods and structures, in various embodiments, can include one or more of the following:

fewer measurements taken of alignment marks;

increase in throughput without loss of alignment accuracy;

the advantages of alignment mark averaging across a shot is obtained.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
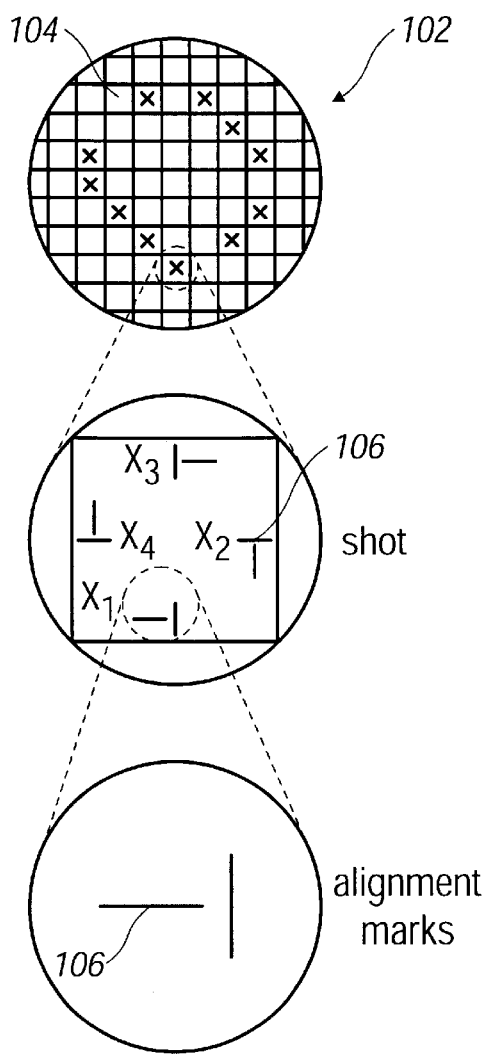
FIG. 1 shows a wafer and patterns with alignment marks.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

The process is an improvement to alignment shot averaging, a practice which is known in the relevant art. Alignment of wafers for photolithography is typically done by sampling alignment marks that are present on several different exposures, or "shots," of a wafer surface. Each shot contains multiple alignment marks, and by measuring offset errors for multiple marks per sampled shot, an average offset can be obtained that is more representative of the average offset than sampling only a single mark per sampled shot.

In the preferred embodiment of a process implementing the innovations of the present application, all alignment marks are measured on each shot that is sampled for alignment offset in only the first wafer of a batch. Each corresponding alignment marks from each sampled shot is averaged, producing several average offsets. For example, if four marks are used on each shot, there will be four average offsets, one for each mark. These average offsets are then averaged to obtain a total offset for that wafer.

Next, the difference between one of these average offsets (i.e., the average offset obtained by averaging ONE mark for each shot) is characterized in terms of the total offset. This produces a value that contains the relationship between the averages of the four marks on each sampled shot. Using this value, the relationship between the alignment marks on succeeding wafers is incorporated into the alignment of the succeeding wafers without having to actually measure those marks. Only one mark from each sampled shot need be measured on succeeding wafers, and using the carried forward value from the first wafer, the total offset is determined.

This innovative method of shot averaging works because of the systematic nature of the errors introduced to alignment during photolithography. For a given batch of wafers, the relationship between the average alignment mark offsets is constant. That is, the average offset for alignment mark #1 (found by averaging the offsets of all #1 alignment marks from each shot) with respect to the average offsets for alignment marks #2, #3, and #4 is constant. Therefore, this relationship is determined from measurements taken on the first wafer only, the relationship is characterized and carried forward to help align succeeding wafers, where this relationship holds. Therefore, all marks on each sampled shot need only be sampled on the first wafer to obtain the relationship between the marks. Succeeding wafers in a batch will require sampling of only one alignment mark per sampled shot, and using the relationship learned from the first wafer, the offset for the succeeding wafers can be derived as shown below.

FIG. 1 shows a wafer 102. The wafer 102 contains many exposures 104 of the pattern. These exposures, or shots, contain alignment marks 106, as shown in the detail. These marks 106 are labeled x1, x2, x3, and x4. Each shot contains multiple alignment marks which serve to orient the wafer for exposure. Multiple shots are sampled, marked with an "x" on FIG. 1. In ordinary systems, measurement data from all marks on all shots are averaged to compensate alignment. This averaging of multiple marks within each shot reduces the error associated with each mark because of its unique position in the shot.

This figure only shows one example of a mark. Mark designs vary widely, with some marks giving both x and y alignment information. Any mark design will work with the present innovations.

All x1s are averaged to get an average value x1bar. Likewise, averages are obtained for the other three marks on each shot, yielding x2bar, x3bar, and x4bar. The total correction needed for the wafer in the x direction is therefore the average of these averages as described in the following equation:

$$\bar{\bar{x}} = (\bar{x_1} + \bar{x_2} + \bar{x_3} + \bar{x_4})/4 \qquad \text{Equation 1}$$

Thus xbarbar for wafer 1 indicates the total offset in the x-direction for wafer 1 alignment. A similar calculation for the y coordinates is also performed, yielding a total offset in the y-direction.

The relationship between x1bar, x2bar, x3bar, and x4bar is constant between wafers in the batch, so their values can be incorporated into the total correction for the second wafer by using data from the first wafer as follows.

$$\bar{x}_{1_{wafer1}} - \bar{\bar{x}}_{wafer1} = \text{carryforward} \qquad \text{Equation 2}$$

For succeeding wafers in the batch, only one alignment mark per sampled shot is measured and included in the average, yielding a value for x1bar only. Using the value in Equation 2 in the following expression yields the total offset for wafer 2 in the x-direction.

$$\bar{\bar{x}}_{wafer2} = \bar{x}_{1_{wafer2}} - (\bar{x}_{1_{wafer1}} - \bar{\bar{x}}_{wafer1}) \qquad \text{Equation 3}$$

The value x1barwafer1−xbarbarwafer1 contains the relationship between the alignment marks on the shots. This relationship does not change when wafers are switched, so it can be used with all wafers of a batch to reduce the number of samples that must be taken per wafer. Using this carry-forward value, only one alignment mark sample need be taken per shot on each wafer, greatly reducing alignment time for each wafer.

The second wafer in the batch is processed next. Only one x-direction wafer alignment mark from each shot need be measured and averaged, yielding x1bar for wafer 2.

Figure 2:
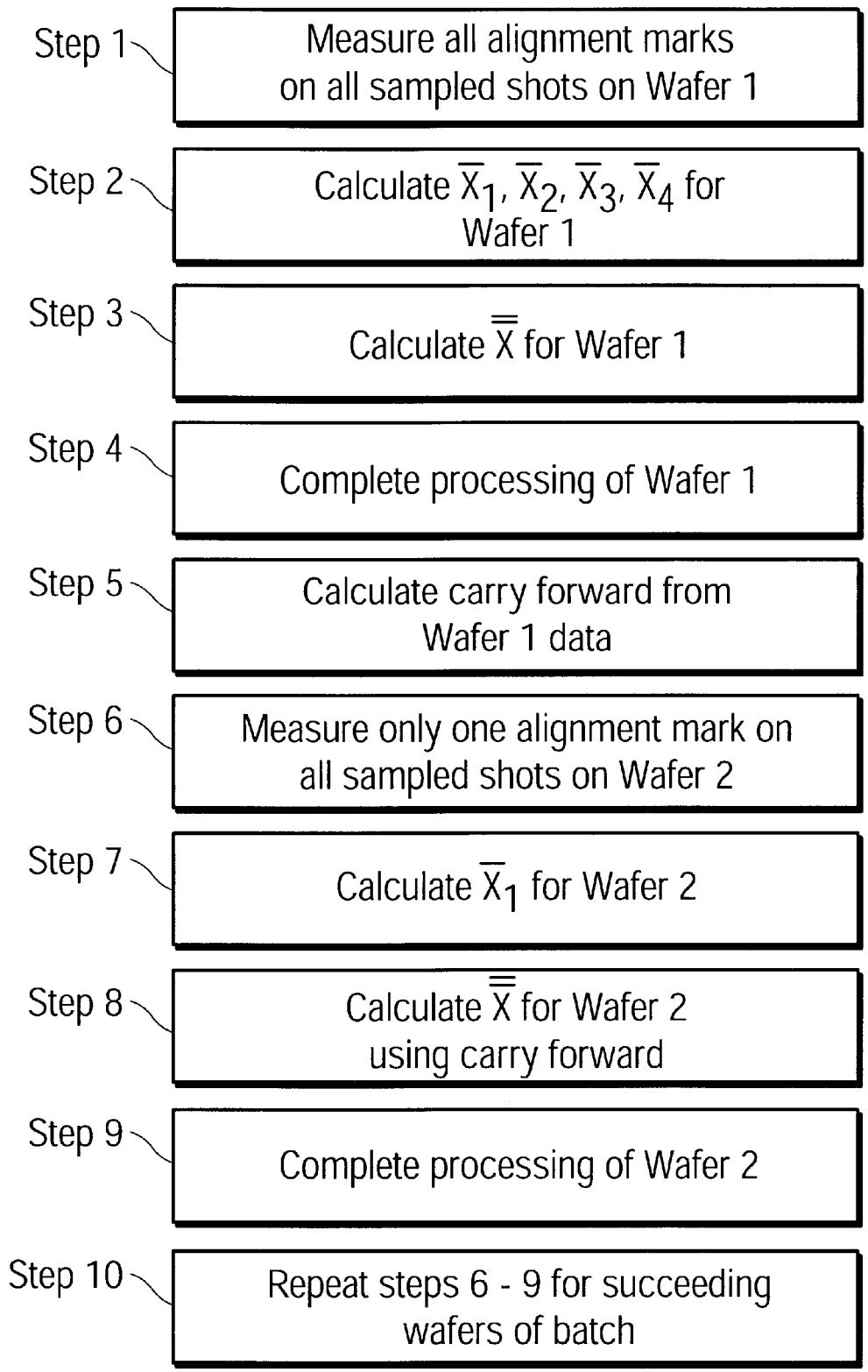
FIG. 2 shows a flowchart for the preferred embodiment.

The process of the preferred embodiment is depicted in FIG. 2. This example assumes a wafer batch of 24 wafers, wherein 12 shots are taken of each wafer, with 4 alignment marks per shot. As a simplification, alignment of the wafers will be explained in only one dimension. Of course, either the same process would need to be repeated to align the wafer in a second, preferably orthogonal direction, or else the alignment marks must incorporate enough data to align the wafer in both directions at once.

In Step 1, measure the four alignment marks for each of shots 1–12 on wafer 1. In Step 2, average the offsets for each alignment mark, yielding x1bar, x2bar, x3bar, x4bar for wafer 1 (assuming 4 marks per shot—where there are n marks per shot, there would be n average offsets). In Step 3 calculate average total offset for wafer 1 using Equation 1.

In Step 4, complete processing of wafer 1, including exposure and overhead tasks. In Step 5, calculate the carry forward from the wafer 1 data, using Equation 2, to be used in aligning all subsequent wafers. In Step 6, measure only the first alignment mark for each of shots 1–12 on wafer 2 (note that other embodiments might choose a subset of marks for subsequent wafers rather than just one mark). In Step 7, average the alignment mark offsets yielding x1bar for wafer 2. In Step 8, calculate the average total offset for wafer 2 using Equation 3. In Step 9, complete processing of wafer 2. In Step 10, repeat Steps 6–9 for the remaining 22 wafers.

Figure 3:
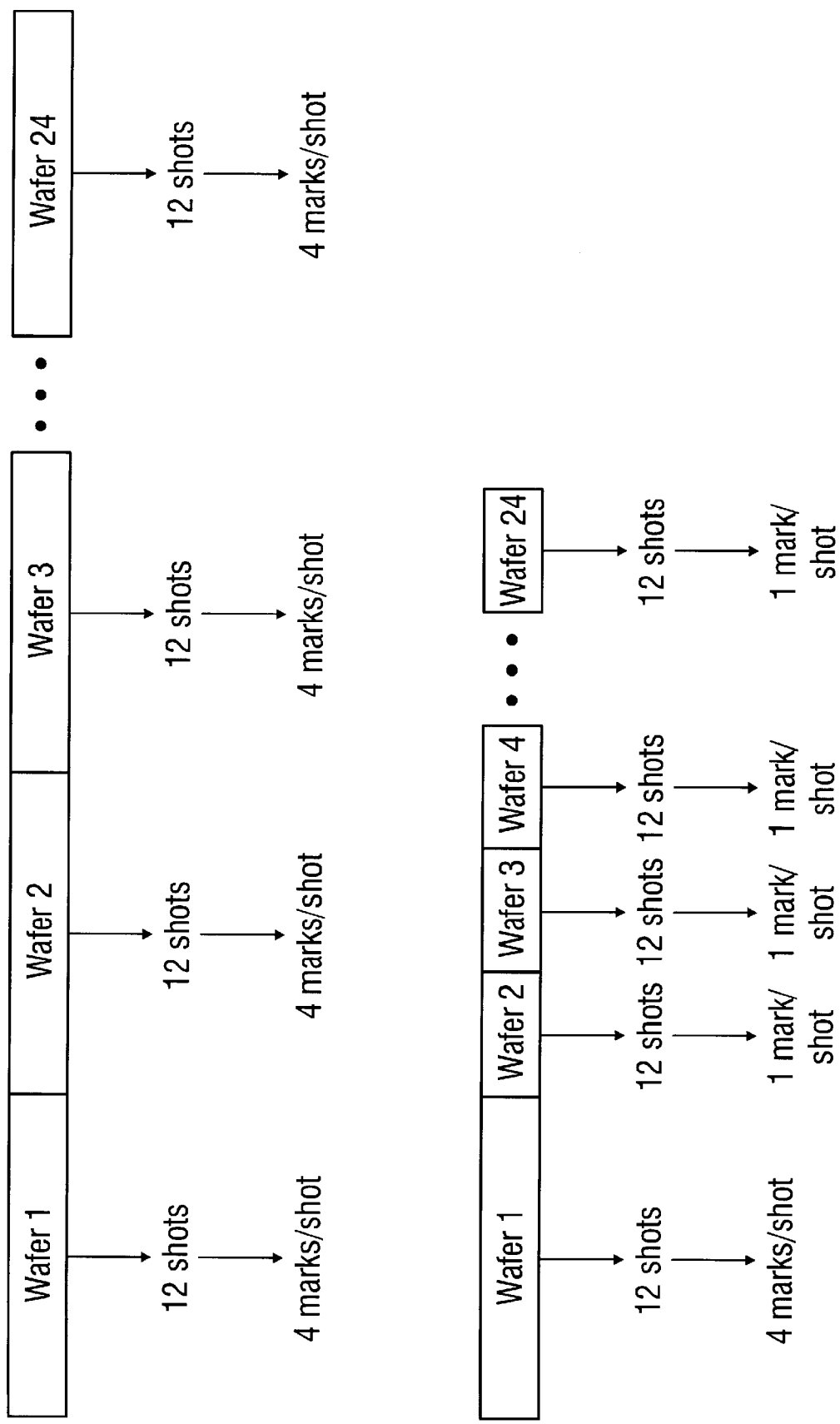
FIG. 3 shows the reduction in measurements required for alignment of a wafer batch.

FIG. 3 shows the reduction in alignment samples required using the preferred embodiment as opposed to previous alignment methods. This figure shows only one possible implementation of the present innovations. In previous methods, several alignment marks (4 in this example) are measured for each of several shots (12 in this example) taken of each wafer of a batch (24 in this example). This results in 1152 alignment measurements taken for the batch. In the preferred embodiment, all 4 alignment marks are measured for each of the 12 shots only on the first wafer, and this data is used to reduce the number of marks measured on succeeding wafers. As shown, only one mark is measured on each of the 12 shots for the remaining wafers 2–24, resulting in a total of only 324 alignment measurements for the batch.

Figure 4:
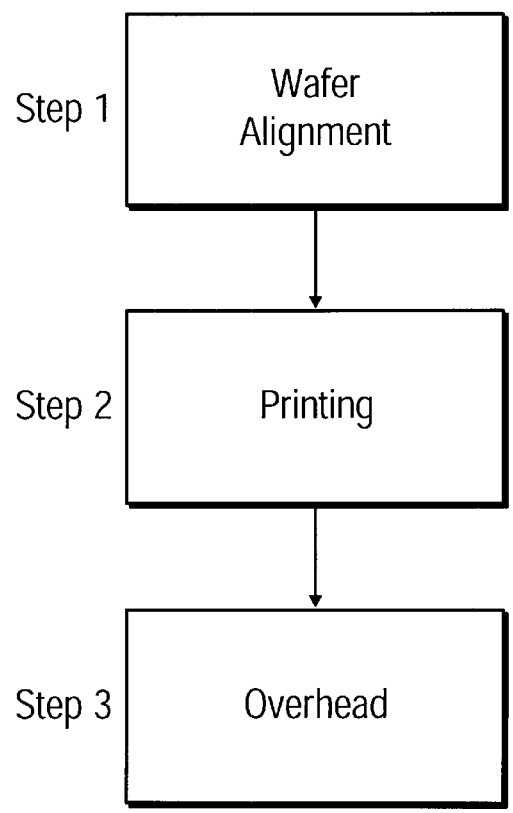
FIG. 4 shows a wafer fabrication process using the innovations of the present application.

FIG. 4 shows a block diagram of a wafer fabrication process implementing the innovations of the present application. In Step 1 the wafer is aligned. In Step 2 a layer is printed on the wafer. This step includes exposure of the pattern, developing, etch, and possibly other steps depending on the specific device fabricated. In Step 3, overhead tasks are performed on the wafer. The process is repeated for succeeding wafers of a batch.

An illustrative example, using fabricated numbers, follows in order to explain the preferred embodiment. For simplicity, only the x-direction offset is shown.

On the first wafer of a batch, four alignment marks, x1, x2, x3, x4, are measured on each sampled shot. The multiple x1 values from each sampled shot are averaged to obtain a value x1bar. Similarly, x2bar, x3bar, and x4bar represent the averages of the other alignment marks. Assume that the following values are found.

$$\bar{x}_1 = +10$$

$$\bar{x}_2 = -5$$

$$\bar{x}_3 = -10$$

$$\bar{x}_4 = +5$$

The total average offset for the first wafer, xbarbar, is the average of these values, which is zero. This represents the total x displacement required to align the wafer in nanometers. (Note that y-direction offsets would be obtained in a similar way.)

Next, the relationship between one of these values (x1bar, for example) is characterized in relation to the total offset for wafer 1 as follows.

$$\bar{x}_{1_{wafer1}} - \bar{\bar{x}}_{wafer1} = \text{carryforward}$$

$$10 - 0 = 10$$

This carryforward includes the relationship between x1bar and the other averages (i.e., x2bar, x3bar, x4bar). This relationship remains constant between wafers in a batch. So by using this carryforward value and the measurement of one alignment mark on succeeding wafers, the total offset can be obtained for the succeeding wafers instead of measuring all the alignment marks on succeeding wafers.

Moving to the second wafer, the average offset for only one alignment mark is measured.

$$\bar{x}_1 = 20$$

Using the carryforward, the total offset for wafer 2 is obtained as follows.

$$\bar{\bar{x}}_{wafer2} = \bar{x}_{1_{wafer2}} - \text{carryforward}$$

$$\bar{\bar{x}}_{wafer2} = 20 - 10 = 10$$

As a check, we can also calculate xbarbarwafer2 using the average offsets from each alignment mark. If we had measured these average offsets, we would expect the values below:

$$\bar{x}_1 = 20$$

$$\bar{x}_2 = 5$$

$$\bar{x}_3 = 0$$

$$\bar{x}_4 = 15$$

$$\bar{\bar{x}}_{wafer2} = (20 + 5 + 0 + 15)/4 = 10$$

This produces the same total offset for wafer 2 as was calculated using the carryforward from the wafer 1 measurements.

The present innovative shot averaging method allows shot averaging with minimal throughput loss. Minimal samples are taken on all but the first wafer, and the information gathered from the first wafer is used to reduce the number of samples taken on succeeding wafers. This greatly reduces the time spent aligning wafers and increases throughput without increasing complexity of the process. The process is implemented in the preferred embodiment as logic in the wafer stepper software. It can contain many variable features, such as how many wafers to use to determine the carryforward value (1 in the examples of the present application) or how many marks to measure per shot on preliminary as well as subsequent wafers.

Definitions:

Following are short definitions of the usual meanings of some of the technical terms which are used in the present application. (However, those of ordinary skill will recognize whether the context requires a different meaning.) Additional definitions can be found in the standard technical dictionaries and journals.

Alignment: correct positioning of a wafer so that successive levels will lie properly with respect to one another within design tolerances.

Batch: a term referring to a number of wafers. Wafers would be of the same batch if they share enough similarity in process so that the innovative alignment method would work. Batches may include lots of wafers, or multiple lots forming one or more trains of lots.

Carryforward: a calculated value containing the relationships between one or more average offsets and the total offset for a wafer.

Exposure: a part of the printing process where one or more patterns are placed, through optic means, on a wafer.

Offset: the difference between the actual location of an alignment mark (or a wafer) and the desired location.

Shot: a single copy or iteration of a pattern on a wafer. Each wafer typically contains many shots.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

In one class of alternative embodiments, the averaging of the marks is accomplished in a different order, or uses different value. For instance, rather than averaging corresponding alignment marks from each sampled shot, all alignment marks from a given shot might be averaged, followed by averaging of the multiple average shot offsets.

In another alternative embodiment, an assumption could be made that the offset relationship holds between shots (as well as between samples on a shot) and the process would only measure one shot per wafer after the first wafer, using information from the first wafer to derive the offset relationships between shots. Though such a process might sacrifice quality for throughput, it is within the contemplation of the present application.

In another class of alternative embodiments, more than one mark (but fewer than all marks) can be measured on subsequent wafers for determining the average offset. Likewise, more than one mark's average offset could be used in determining the carryforward value.

Other modifications include selectively choosing which mark to use in averaging, considering elements such excessive distortion in certain areas of the shots or wafers or other irregularities that might throw averages off. Certain alignment marks might also be excluded for the same reasons.

The presently preferred embodiment described the present innovations in terms of a stepper system. In the case of a step-and-scan system, similar assumptions may be made, about a mark's offset in relation to the field of exposure for a step-and-scan system. In both cases the idea is to find offsets that are repeatable. In a stepper system, the errors are caused mainly by lens imperfections, whereas in a step-and-scan system the errors are caused by the convolution of the lens and scanning stages.

Combinational marks, giving both x-direction and y-direction orientation are also compatible with the present innovations. Also, instead of a single mark measured on subsequent wafers' shots, a subset of marks could be used, which would still decrease the total number of measurements taken.

In another variation, the carryforward value (or an equivalent) could be stored somewhere as a reference for future runs, alleviating the need to repeat average offset measurements of all alignment marks on the first wafer of a run.

Additional general background, which help to show the knowledge of those skilled in the art regarding variations and implementations of the disclosed inventions, may be found in the following documents, all of which are hereby incorporated by reference: HANDBOOK OF MICROLITHOGRAPHY, MICROMACHINING, AND MICROFABRICATION ed. P. Rai-Choudhury (1997).

What is claimed is:

1. A method of wafer alignment, comprising the steps of:

sampling a first plurality of marks on a plurality of sampled shots on a first wafer to thereby align said first wafer;

sampling fewer than said first plurality of marks on a plurality of sampled shots on succeeding wafers to thereby align said succeeding wafers.

2. The method of claim 1, wherein said first plurality of marks is four marks.

3. A method of wafer alignment, comprising the steps of:

measuring a plurality of alignment marks on each of a plurality of sampled shots on a first wafer to thereby align said first wafer;

measuring only one mark on each of a plurality of sampled shots on a second wafer to thereby align said second wafer.

4. The method of claim 3, wherein said second wafer is aligned using information gathered from alignment of said first wafer.

5. A method of wafer alignment, comprising the steps of:

sampling multiple marks on each of all sampled shots of a first wafer to produce multiple offset values;

averaging said multiple offset values of said marks to produce a total offset for said first wafer;

characterizing a relationship between a single mark on each of all sampled shots on said first wafer and said total offset for said first wafer to produce a first value;

sampling a single mark on each of all sampled shots on a second wafer to produce a second value;

using said first value and said second value to calculate a total offset for said second wafer.

6. The method of claim 5, wherein said first value is the difference between the average of said single marks on each of all sampled shots on said first wafer and said total offset for said first wafer.

7. A method of wafer alignment, comprising the steps of:

measuring m offsets on each of n marks on each of m sampled shots on a first wafer;

for each of said n marks on each of m sampled shots, calculating an average offset, producing n average offsets;

calculating a total offset for said first wafer by averaging said n average offsets;

characterizing the difference between one of said n average offsets and said total offset for said first wafer to produce a first value;

on a second wafer, measuring a plurality of offsets of one mark on each sampled shot;

calculating an average offset from said plurality of offsets;

using said first value and said average offset of said second wafer, calculating a total offset for said second wafer.

8. The method of claim 7, wherein said n marks number 4.

9. A fabrication method, comprising the steps of:

aligning a wafer, said step of aligning including the characterization of the offset between a set of alignment marks with respect to the total offset of said wafer to produce a value, and using said value to align subsequent wafers;

printing a pattern on a wafer of said batch.

10. The method of claim 9, wherein said batch includes multiple lots of wafers.

11. A method of wafer alignment in a semiconductor fabrication process, comprising the steps of:

providing a plurality of wafers including a first wafer, each of said wafers having a plurality of alignment marks thereon;

sampling said plurality of alignment marks on said first wafer in a plurality of sampled shots to align said first wafer; and sampling fewer than said plurality of alignment marks of the remainder of said plurality of wafers in response to said sampling of said first wafer to align said remainder of said plurality of wafers.

* * * * *